(12) United States Patent
Jeong et al.

(10) Patent No.: US 10,121,566 B2
(45) Date of Patent: Nov. 6, 2018

(54) COMPOSITION FROM FORMING CONDUCTIVE PATTERN AND RESIN STRUCTURE HAVING CONDUCTIVE PATTERN THEREON

(71) Applicant: LG CHEM, LTD., Seoul (KR)

(72) Inventors: Han Nah Jeong, Daejeon (KR); Cheol-Hee Park, Daejeon (KR); Sang Yun Jung, Daejeon (KR); Jae Jin Kim, Daejeon (KR); Chee-Sung Park, Daejeon (KR); Jae Hyun Kim, Daejeon (KR); Shin Hee Jun, Daejeon (KR)

(73) Assignee: LG CHEM, LTD., Seoul (KR)

( * ) Notice: Subject to any disclaimer, the term of this patent is extended or adjusted under 35 U.S.C. 154(b) by 415 days.

(21) Appl. No.: 14/913,265

(22) PCT Filed: Dec. 17, 2014

(86) PCT No.: PCT/KR2014/012487
§ 371 (c)(1),
(2) Date: Feb. 19, 2016

(87) PCT Pub. No.: WO2015/102270
PCT Pub. Date: Jul. 9, 2015

(65) Prior Publication Data
US 2016/0203886 A1    Jul. 14, 2016

(30) Foreign Application Priority Data

Dec. 30, 2013  (KR) .................. 10-2013-0167675
Dec. 16, 2014  (KR) .................. 10-2014-0181437

(51) Int. Cl.
*H01B 1/22*    (2006.01)
*H05K 1/09*    (2006.01)
(Continued)

(52) U.S. Cl.
CPC .............. *H01B 1/22* (2013.01); *C08K 3/10* (2013.01); *C08K 3/32* (2013.01); *H05K 1/095* (2013.01);
(Continued)

(58) Field of Classification Search
CPC ...... H01B 1/22; C08K 3/32; Y10T 428/24802
See application file for complete search history.

(56) References Cited

U.S. PATENT DOCUMENTS 4,977,007 A * 12/1990 Kondo ................. G02F 1/1525
                                                    264/104
5,599,592 A     2/1997 Laude
(Continued)

FOREIGN PATENT DOCUMENTS

CN     100414746 C    5/2005
CN     100495801 C    6/2009
(Continued)

OTHER PUBLICATIONS

Gimenez et al. "Formation of a Novel Polypyrrole/Porous Phosphate Glass Ceramic Nanocomposite", J. Braz. Chem. Soc., 1999, vol. 10, p. 167-168 (Year: 1999).*

(Continued)

*Primary Examiner* — Gerard Higgins
(74) *Attorney, Agent, or Firm* — Dentons US LLP

(57) ABSTRACT

This disclosure relates to a composition for forming a conductive pattern that enables formation of fine conductive pattern on various polymer resin products or resin layers by a simplified process, and more effectively fulfills requirements of the art such as realization of various colors and the like, and a resin structure having a conductive pattern. The composition for forming a conductive pattern comprises a polymer resin; and a non-conductive metal compound including a first metal and a second metal, having a NASI-
(Continued)

US 10,121,566 B2
Page 2

CON crystal structure represented by the following Chemical Formula 1, wherein a metal nucleus including the first metal or an ion thereof is formed from the non-conductive metal compound by electromagnetic irradiation.

12 Claims, 3 Drawing Sheets

(51) Int. Cl.
    *C08K 3/10*      (2018.01)
    *C08K 3/32*      (2006.01)

(52) U.S. Cl.
    CPC .................. *Y10T 428/24802* (2015.01); *Y10T 428/24909* (2015.01)

(56) References Cited

U.S. PATENT DOCUMENTS

| | | | |
|---|---|---|---|
| 6,451,487 B1* | 9/2002 | Besner | H01M 4/02 429/304 |
| 8,309,640 B2 | 11/2012 | Li et al. | |
| 9,660,241 B2* | 5/2017 | Wang | H01M 4/1397 |
| 2011/0281135 A1 | 11/2011 | Gong et al. | |
| 2012/0276390 A1 | 11/2012 | Ji et al. | |
| 2012/0279764 A1 | 11/2012 | Jiang et al. | |
| 2014/0186719 A1* | 7/2014 | Wang | H01M 4/58 429/309 |

FOREIGN PATENT DOCUMENTS

| | | |
|---|---|---|
| EP | 2087942 A1 | 8/2009 |
| EP | 2555601 A1 | 2/2013 |
| JP | 2002067000 A | 3/2002 |
| JP | 2004534408 A | 11/2004 |
| JP | 2007-287994 A | 11/2007 |
| JP | 2012524169 A | 10/2012 |
| JP | 2013541846 A | 11/2013 |
| JP | 2013544296 A | 12/2013 |
| JP | 2013545832 A | 12/2013 |
| KR | 10-2004-0021614 A | 10/2004 |
| KR | 10-2005-0077281 A | 8/2005 |
| KR | 10-2009-0061225 A | 6/2009 |
| KR | 10-2011-0018319 A | 2/2011 |
| KR | 10-2011-0112860 A | 10/2011 |
| KR | 10-2012-0107515 A | 10/2012 |
| KR | 10-2012-0121219 A | 11/2012 |
| KR | 10-2012-0124167 A | 11/2012 |
| KR | 10-2014-0048197 A | 4/2014 |
| KR | 10-2014-0128233 A | 11/2014 |

OTHER PUBLICATIONS

"Tin-containing nasicon-related compounds: a new mixed valence compound.."; 3. Journal of Alloys and Compounds, vol. 257, pp. 201-204 (1997).
"The Nasicon-like copper(II) titanium . . . "; 14. J. Solid State Chem., 1986, vol. 65, No. 3, pp. 351-355.
"Catalytic properties of copper-manganese mixed oxides . . . "; 18. Catal. Sci. Technol., 2014,4, 3713-3722.
"RbSn2(PO4)3, a NASICON-type phosphate'" 19. Acta Cryst., 2011.

\* cited by examiner

[FIG. 1]
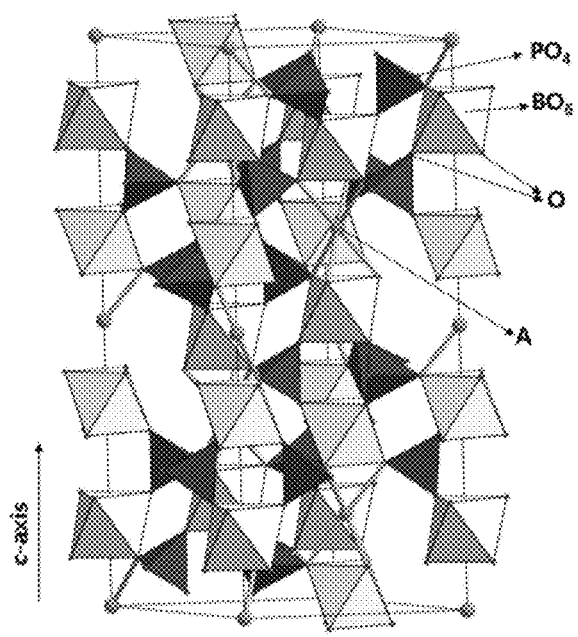
[FIG. 2]
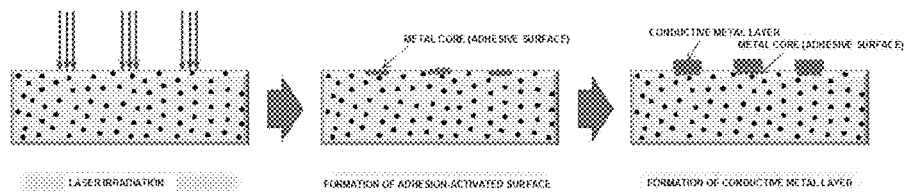

[FIG. 3a]
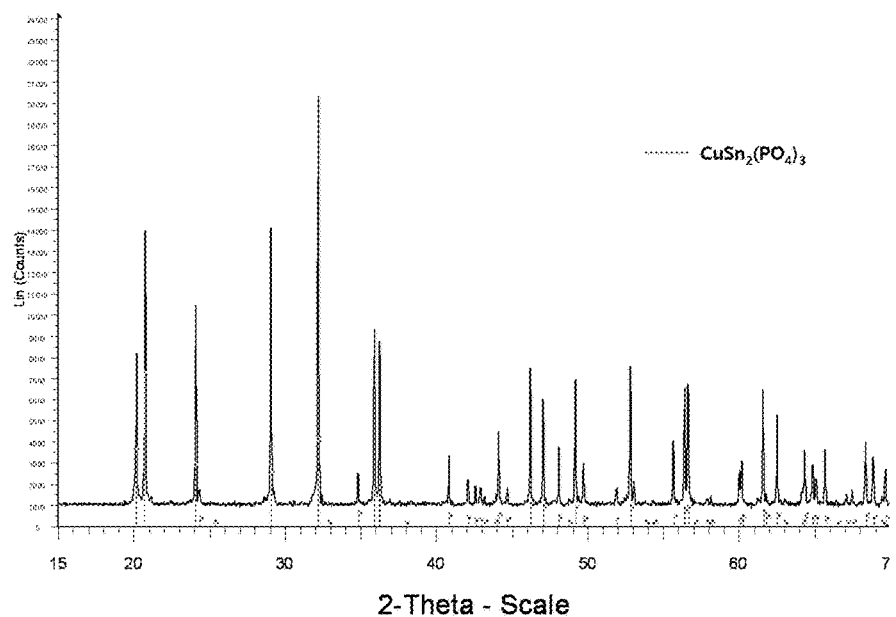
[FIG. 3b]
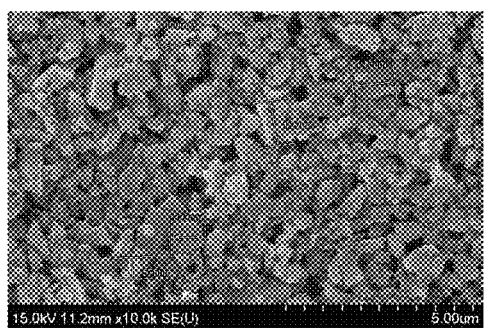

[FIG. 4]
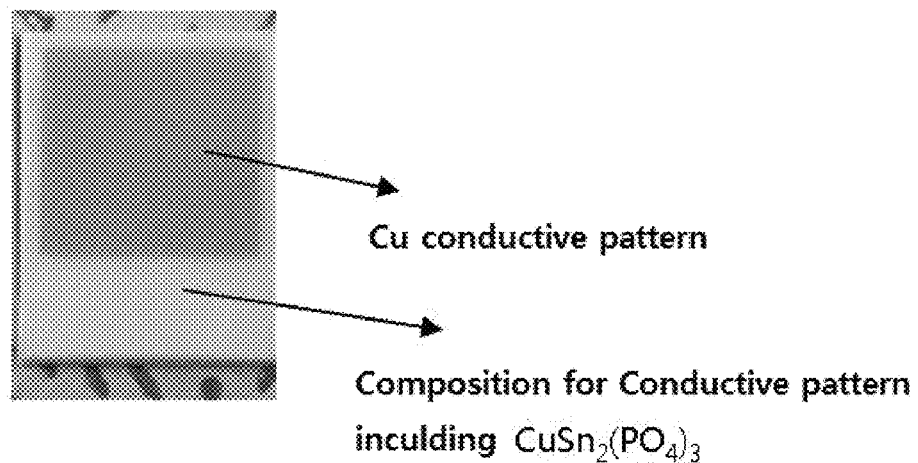
[FIG. 5]
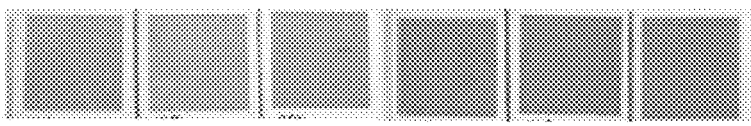
Cu conductive pattern
Composition for Conductive pattern inculding $CuSn_2(PO_4)_3$
[FIG. 6]
Example2 Example3 Example4 Example5 Example6 Example7

COMPOSITION FROM FORMING CONDUCTIVE PATTERN AND RESIN STRUCTURE HAVING CONDUCTIVE PATTERN THEREON

This application is a National Stage Entry of International Application No. PCT/KR2014/012487, filed Dec. 17, 2014 and claims the benefit of and priority to Korean Application Nos. 10-2013-0167675, filed on Dec. 30, 2013, and 10-2014-0181437, filed Dec. 16, 2014 all of which are hereby incorporated by reference in their entirety for all purposes as if fully set forth herein.

TECHNICAL FIELD

The present invention relates to a composition for forming a conductive pattern that enables formation of fine conductive patterns on a variety of polymer resin products or resin layers by a simplified process, and more effectively fulfills requirements of the art such as realization of various colors and the like, and a resin structure having a conductive pattern.

BACKGROUND

With the recent development of microelectronic technology, a need for structures having a fine conductive pattern formed on the surface of a polymeric resin substrate (or product) such as a variety of resin products or resin layers has grown. The conductive patterns on the surface of the polymeric resin substrate and the structure may be applied to form various objects such as antennas integrated into a mobile phone case, a variety of sensors, MEMS structures, RFID tags, and the like.

As such, with increasing interest in the technology of forming the conductive pattern on the surface of the polymeric resin substrate, several technologies regarding this were suggested. However, a more effective method for these technologies has not been suggested yet.

For example, according to the previous technology, a method for forming the conductive pattern by forming a metal layer on the surface of the polymeric resin substrate and then applying photolithography, or a method for forming the conductive pattern by printing a conductive paste may be considered. However, when the conductive pattern is formed according to this technology, there are limitations that a process or equipment to be needed becomes too complicated, or it is difficult to form an excellent fine conductive pattern Accordingly, there is a need to develop a technology capable of more effectively forming the fine conductive pattern on the surface of the polymeric resin substrate by a simple process.

In order to fulfill the demand in the art, a method of simply forming the conductive pattern on the surface of polymeric resin base by including a specific inorganic additives in the resin, irradiating electromagnetic wave such as laser and the like to a region on which a conductive pattern is to be formed, and then, progressing plating on the region to which the electromagnetic wave irradiated has been suggested.

However, according to this method, since the kinds of inorganic additives previously suggested are extremely limitative, it may be difficult to fulfill a variety of requirements of the art, for example, realization of a variety of colors and the like. Thus, there is a demand for development of various kinds of inorganic additives capable of fulfilling a variety of requirements of the art.

SUMMARY OF THE INVENTION

The present invention provides a composition for forming a conductive pattern that enables formation of fine conductive patterns on various polymer resin products or resin layers by a simplified process, and more effectively fulfills requirements of the art such as realization of a variety of colors and the like.

Further, the present invention provides a resin structure having a conductive pattern formed by a method of forming a conductive pattern, from the composition for forming a conductive pattern and the like.

The present invention provides a composition for forming a conductive pattern by electromagnetic irradiation, comprising: a polymer resin; and a non-conductive metal compound including a first metal and a second metal, having a NASICON crystal structure represented by the following Chemical Formula 1, wherein a metal nucleus including the first metal or an ion thereof is formed from the non-conductive metal compound by electromagnetic irradiation.

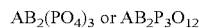  [Chemical Formula 1]

in the Chemical Formula 1,

A, B are independently represents a first metal and a second metal different from each other.

In the composition for forming a conductive pattern, A in the Chemical Formula 1 may represent at least one metal selected from the group consisting of Cu, Ag and Au, and B may represent at least one metal selected from the group consisting of Sn, Ti, Zr, Ge, Hf, Zn, Mn, Co, Ni, Cd, Pd and Pt.

And, in the non-conductive metal compound of a NASICON crystal structure, an octahedron of $BO_6$ and a tetrahedron of $PO_4$ may be three-dimensionally connected while sharing oxygen, and metal A or an ion thereof may be positioned in a channel formed by a crystal lattice array of the octahedron and the tetrahedron. More specifically, in the crystal structure, the channel may be formed at a site surrounded by 6 oxygens along the c axis of the crystal lattice, and the site may be partially filled with the metal A or an ion thereof.

And, in the composition for forming a conductive pattern, the non-conductive metal compound may have L value according to CIE Lab color coordinate of about 90 or more, or about 90 to 95, a* value of about −10 to 10, or about −7 to 7, and b* value of about −3 to 20, or about 1 to 15.

Meanwhile, in the composition for forming a conductive pattern, the polymer resin may be thermosetting resin or thermoplasitc resin, and more specific examples thereof may include at least one selected from the group consisting of ABS (Acrylonitile poly-butadiene styrene) resin, polyalkyleneterephthalate resin, polycarbonate resin, polypropylene resin, and polyphthalamide resin.

And, in the composition for forming a conductive pattern, the non-conductive metal compound may be included in the content of about 0.1 to 15 wt % based on the total composition.

And, the composition for forming a conductive pattern may further comprise one or more additives selected from the group consisting of a flame retardant, a heat stabilizer, a UV stabilizer, a lubricant, an antioxidant, an inorganic filler, a colorant, an impact modifier, and a functional modifier, and as the flame retardant, a phosphorous based flame retardant or an inorganic flame retardant may be appropriately used.

Meanwhile, the present invention also provides a resin structure having a conductive metal layer (conductive pattern) formed on the surface of a polymeric resin substrate using the above explained composition for forming a conductive pattern. The resin structure having a conductive pattern comprises a polymeric resin substrate; a non-conductive metal compound dispersed in the polymeric resin substrate, and having a NASICON crystal structure represented by the following Chemical Formula 1; an adhesion-activated surface including a metal nucleus including a first metal or an ion thereof exposed on a surface of a predetermined region of the polymeric resin substrate; and a conductive metal layer formed on the adhesion-activated surface.

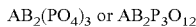  [Chemical Formula 2]

in the Chemical Formula 1,

A, B are independently represents a first metal and a second metal different from each other.

In the resin structure having a conductive pattern, the predetermined region on which the adhesion-activated surface and the conductive metal layer are formed may correspond to a region of the polymeric resin substrate to which an electromagnetic wave is irradiated.

And, the resin structure may have impact strength of about 4.0 J/cm or more, as measured as Izod notched type according to ASTM D256.

ADVANTAGEOUS EFFECTS

According to the present invention, provided is a composition for forming a conductive pattern that enables formation of fine conductive patterns by a simplified process of irradiating electromagnetic waver such as laser and the like on a polymeric resin substrate of a variety of polymer resin products or resin layers and the like.

Particularly, if the composition for forming a conductive pattern is used, requirement of the art for realizing a variety of colors of a resin structure (a variety of polymer resin products or resin layers and the like) may be more effectively fulfilled, and yet, satisfactory conductive patterns may be easily formed on the resin structure.

Thus, the composition for forming a conductive pattern may be used to effectively form antennas integrated into a mobile phone case or a tablet PC case, RFID tags, a variety of sensors, MEMS structures, and the like.

DESCRIPTION OF DRAWINGS

FIG. 1 schematically shows the NASICON crystal structure of one example of the non-conductive metal compound included in the composition for forming a conductive pattern according to one embodiment of the invention.

FIG. 2 simplifies and shows one example of the method for forming a conductive pattern using the composition according to one embodiment.

FIGS. 3a and 3b respectively show the XRD pattern and the electron microscope image of the non-conductive metal compound obtained in Preparation Example 1.

FIG. 4 compares the color coordinates and the photographs of the non-conductive metal compounds of Preparation Example 1 and Comparative Preparation Examples 1 to 3.

FIGS. 5 and 6 show the photographs of the resin structures having a conductive pattern obtained in Examples 1 to 7.

DETAILED DESCRIPTION OF THE EMBODIMENTS

Hereinafter, a composition for forming a conductive pattern, and a resin structure having a conductive pattern formed therefrom according to specific embodiments of the invention will be explained.

According to one embodiment of the invention, provided is a composition for forming a conductive pattern by electromagnetic irradiation, comprising: a polymer resin; and a non-conductive metal compound including a first metal and a second metal, having a NASICON crystal structure represented by the following Chemical Formula 1, wherein a metal nucleus including the first metal or an ion thereof is formed from the non-conductive metal compound by electromagnetic irradiation.

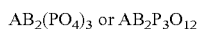  [Chemical Formula 1]

in the Chemical Formula 1,

A, B are independently represents a first metal and a second metal different from each other.

In the composition for forming a conductive pattern, A in the Chemical Formula 1 may represent at least one metal selected from the group consisting of Cu, Ag and Au, and B may represent at least one metal selected from the group consisting of Sn, Ti, Zr, Ge, Hf, Zn, Mn, Co, Ni, Cd, Pd and Pt.

As such, the composition for forming a conductive pattern according to one embodiment of the invention comprises a non-conductive metal compound of the Chemical Formula 1 with a NASICON structure. FIG. 1 schematically shows the NASICON crystal structure of one example of the non-conductive metal compound.

Referring to FIG. 1, in the non-conductive metal compound with a NASICON crystal structure, an octahedron of $BO_6$ and a tetrahedron of $PO_4$ are three-dimensionally connected while sharing oxygen (namely, form a backbone of a crystal structure of the whole NASICON structure), and metal A or an ion thereof is positioned in a channel formed by crystal lattice array of the octahedron and the tetrahedron.

More specifically, in such a crystal structure, particularly in the crystal structure of the Chemical Formula 1, the channel may be formed at a site surrounded by 6 oxygens along the c axis of crystal lattice, and the site may be partially filled with the metal A or an ion thereof.

As will be explained in more detail below, if a polymer resin product or resin layer is formed using the composition for forming a conductive pattern comprising the non-conductive metal compound with NASICON structure, and then, electromagnetic wave such as laser and the like is irradiated to a predetermined region, a metal nucleus including a first metal or an ion thereof may be formed from the non-conductive metal compound. Although the non-conductive metal compound with NASICON structure is chemically stable under general environment, if exposed to electromagnetic wave of a specific wavelength, the first metal or an ion thereof represented by A may be easily separated therefrom. Thus, by irradiating electromagnetic wave, the metal nucleus may be more easily formed.

More specifically, in the NASICON crystal structure (particularly, the crystal structure of the Chemical Formula 1), since the first metal, for example, metal A may exist freely even in restriction of any crystal lattice, it is expected that if the non-conductive metal compound with such a crystal structure is exposed to stimulation of an electromagnetic wave of a specific wavelength, the first metal or an ion thereof may be easily separated. According to specific embodiment, in the case of a non-conductive metal compound such as $CuSn_2(PO_4)_3$ of example described below, although it basically has chemical stability, when exposed to electromagnetic wave such as laser, Cu or $Cu^{1+}$ may be easily separated therefrom to form a metal nucleus, which is expected to result from the unique crystal structure of the above explained NASICON structure.

Thus formed metal nuclei may be selectively exposed on a predetermined region to which electromagnetic wave is irradiated, to form an adhesion-activated surface on the surface of a polymeric resin substrate. And then, if the metal nuclei including the first metal or an ion thereof is chemically reduced, or electroless plating is conducted with a plating solution including conductive metal ion and the like using the metal nuclei as a seed, a conductive metal layer may be formed on the adhesion-activated surface including the metal nuclei. Particularly, as explained above, due to the structural characteristics of the NASICON crystal structure, if electromagnetic wave such as laser is irradiated to the non-conductive metal compound, the first metal or an ion thereof may easily move along the three-dimensionally connected channel, thus easily forming a conductive pattern on the polymeric resin substrate by reduction or plating.

Meanwhile, in the composition of one embodiment, the specific non-conductive metal compound with NASICON crystal structure exhibits non-conductivity before irradiation of electromagnetic wave, has excellent compatibility with the polymer resin, and is chemically stable to the solution used for reduction or plating and thus maintains non-conductivity.

Thus, the non-conductive metal compound with NASICON crystal structure is maintained chemically stable while uniformly dispersed in a polymeric resin substrate to exhibit non-conductivity, in a region to which electromagnetic wave is not irradiated. To the contrary, in a region to which electromagnetic wave such as laser and the like is irradiated, a first metal or an ion thereof may be easily generated from the non-conductive metal compound with NASICON structure, to form metal nuclei and a fine conductive pattern by the above explained principle.

Thus, by using the composition of the above explained embodiment, a fine conductive pattern may be formed by a simplified process of irradiating electromagnetic wave such as laser on a polymeric resin substrate such as a variety of polymer resin products or resin layers, and particularly, a metal nucleus facilitating the formation of the conductive pattern may be very easily formed, and thus, a better conductive pattern may be very easily formed compared to the previously known compositions.

In addition, the non-conductive metal compound with NASICON crystal structure, representatively a compound such as $CuSn_2(PO_4)_3$ may exhibit relatively bright color, and may hardly change the colors of a variety of polymer resin products or resin layers and the like.

More specifically, the non-conductive metal compound may have L value according to CIE Lab color coordinate of about 90 or more, or about 90 to 95, a* value of about −10 to 10, or about −7 to 7, and b* value of about −3 to 20, or about 1 to 15. Namely, since the non-conductive metal compound may have L value of about 90 or more and thus exhibit a bright color close to white, it may maintain unique colors of a variety of polymer resin products or resin layers without substantially changing the colors, or express the colors of a colorant such as pigment and the like.

Thus, by using the composition comprising the non-conductive metal compound according to one embodiment, requirements of the art for realizing various colors of a variety of polymer resin products even with a small amount of a colorant may be effectively fulfilled.

Meanwhile, in the composition for forming a conductive pattern of the above explained embodiment, as the polymer resin, any thermosetting resin or thermoplastic resin capable of forming a variety of polymer resin products or resin layers may be used without specific limitations. Particularly, the above explained non-conductive metal compound may exhibit excellent compatibility and uniform dispersibility with a variety of polymer resins, and the composition of one embodiment may comprise various polymer resins and be molded into a variety of resin products or resin layers. Specific examples of the polymer resin may include ABS resin, polyalkyleneterephthalate resin such as polybutyleneterephthalate resin or polyethyleneterephthalate resin, polycarbonate resin, polypropylene resin or polyphthalamide resin and the like, and besides, it may include various polymer resins.

And, in the composition for forming a conductive pattern, the non-conductive metal compound with NASICON structure may be included in the content of about 0.1 to 15 wt %, or about 3 to 13 wt % based on the total composition, and the remaining content of the polymer resin may be included. Due to the content range, basic physical properties such as mechanical properties of the polymer resin product or resin layer formed from the composition may be appropriately maintained, and yet, a conductive pattern may be formed in a specific region by irradiation of electromagnetic wave.

And, the composition for forming a conductive pattern may further comprise at least one additives selected form the group consisting of a flame retardant, a heat stabilizer, a UV stabilizer, a lubricant, an antioxidant, an inorganic filler, a colorant, an impact modifier and a functional modifier, in addition to the above explained polymer resin and non-conductive metal compound. By including the additives, the properties of the resin structure obtained from the composition of one embodiment may be appropriately modified. Among the additives, the colorant, for example, pigment may be included in the content of about 0.1 to 10 wt % to afford desired color to the resin structure.

Specific examples of the colorant such as pigment may include white pigment such as ZnO, Talc, $TiO_2$, $SnO_2$, or $BaSO_4$ and the like, and besides, colorants such as pigments of various kinds and colors known to be usable in a polymer resin composition may be used.

The flame retardant may include a phosphorous based flame retardant and an inorganic flame retardant. More specifically, the phosphorous based flame retardant may include phosphate ester based flame retardant such as triphenyl phosphate (TPP), trixylenyl phosphate (TXP), tricresyl phosphate (TCP), or triisophenyl phosphate (REOFOS) and the like; aromatic polyphosphate based flame retardant; polyphosphate based flame retardant; or red phosphorous based flame retardant and the like, and besides, various phosphorous based flame retardants known to be usable in a resin composition may be used without specific limitations. And, the inorganic flame retardant may include aluminum hydroxide, magnesium hydroxide, zinc borate, molybdenum oxide ($MoO_3$), molybdenum peroxide salt ($Mo_2O_7^{2-}$), calium-zinc-molybdate, antimony trioxide ($Sb_2O_3$), or antimony pentoxide ($Sb_2O_5$) and the like. However, the examples of the inorganic flame retardant are not limited thereto, and various inorganic flame retardants known to be usable in a resin composition may be used without specific limitations.

And, the impact modifier, heat stabilizer, UV stabilizer, lubricant or antioxidant may be included in the content of about 0.1 to 5 wt %, or about 0.05 to 3 wt %, to appropriately afford desired properties to the resin structure.

Hereinafter, a method for forming a conductive pattern by direct irradiation of electromagnetic wave on a polymeric resin substrate of a resin product or a resin layer using the composition for forming a conductive pattern of the above explained embodiment will be explained in detail. The method for forming a conductive pattern comprises the steps of molding the above explained composition for forming a conductive pattern into a resin product, or coating it on another product to form a resin layer; irradiating electromagnetic wave to a predetermined region of the resin product or the resin layer to generate a metal nucleus comprising a first metal or an ion thereof from the non-conductive metal compound with NASICON structure; and chemically reducing or plating the region on which metal-nucleus are generated to form a conductive metal layer.

Referring to the attached drawings, the method for forming a conductive pattern will be explained according to each step. For reference, FIG. 2 simplifies and shows each step of one example of the method for forming a conductive pattern.

In the method for forming a conductive pattern, first, the above explained composition for forming a conductive pattern is molded into a resin product, or is coated on another product to form a resin layer. For the molding of a resin product or formation of a resin layer, common molding method or method of forming a resin layer using a polymer resin composition may be applied without specific limitations. For example, for the molding of a resin product using the composition, the composition for forming a conductive pattern may be extruded and cooled and then formed in the form of a pellet or particle, which is injection molded in a desired shape to prepare various polymer resin products.

Thus formed polymer resin product or resin layer may have a morphology wherein the above explained non-conductive metal compound is uniformly dispersed in a resin substrate formed from the polymer resin. Particularly, since the non-conductive metal compound with NASICON structure has excellent compatibility and chemical stability with various polymer resins, it may be uniformly dispersed over the whole area of the resin substrate and maintained non-conductive.

After forming the polymer resin product or resin layer, as shown in the first drawing of FIG. 2, an electromagnetic wave such as laser is irradiated to a predetermined region of the resin product or the resin layer. By the irradiation of an electromagnetic wave, a first metal or an ion thereof may be discharged from the non-conductive metal compound with NASICON structure, and metal nuclei comprising the same may be generated (see the second drawing of FIG. 2).

More specifically, if the step of generating metal nucleus by irradiation of an electromagnetic wave is progressed, a part of the non-conductive metal compound with NASICON structure is exposed to the surface of a predetermined region of the resin product or resin layer, and metal nuclei are generated therefrom, thus forming an adhesion-activated surface. As the adhesion-activated surface is selectively formed only in a specific region to which electromagnetic wave is irradiated, if a plating step as described below is progressed, conductive metal ions included in the metal nuclei and the adhesion-activated surface are chemically reduced by chemical reduction or electroless plating, thus selectively forming a conductive metal layer on a predetermined region of the polymeric resin substrate. More specifically, during the electroless plating, the metal nucleus acts as a kind of a seed, and thus, when conductive metal ion included in the plating solution is chemically reduced, it may strongly bond thereto. As the result, the conductive metal layer may be selectively formed more easily.

Meanwhile, in the step of generating metal nuclei, among electromagnetic waves, a laser electromagnetic wave may be irradiated, and for example, a laser electromagnetic wave with a wavelength of about 248 nm, about 308 nm, about 355 nm, about 532 nm, about 585 nm, about 755 nm, about 1064 nm, about 1550 nm or about 2940 nm may be irradiated. According to another embodiment, a laser electromagnetic wave with a wavelength of IR region may be irradiated. And, the laser electromagnetic wave may be irradiated under common conditions or power.

By the irradiation of laser, metal nuclei may be more effectively generated from the non-conductive metal compound with NASICON structure, and an adhesion-activated surface comprising the same may be selectively generated and exposed on a predetermined region.

Meanwhile, after progressing the step of generating metal nuclei, as shown in the third drawing of FIG. 2, the region on which metal nuclei are generated is chemically reduced or plated to form a conductive metal layer. As the result of progressing the reducing or plating step, a conductive metal layer may be selectively formed on a predetermined region on which the metal nuclei and the adhesion-activated surface are exposed, and in the other regions, the chemically stable non-conductive metal compound may maintain non-conductivity. Thereby, a fine conductive pattern may be selectively formed on a predetermined region of the polymeric resin substrate.

More specifically, the step of forming a conductive metal layer may be progressed by electroless plating, thereby forming a satisfactory conductive metal layer on the adhesion-activated surface.

According to one embodiment, in the reducing or plating step, the resin product or the resin layer in a predetermined region on which metal nuclei are generated may be treated with an acidic or basic solution including a reducing agent, wherein the solution may include at least one selected from the group consisting of formaldehyde, hypophosphite, dimethylaminoborane (DMAB), diethylaminoborane (DEAB) and hydrazine as the reducing agent. And, in the reducing or plating step, it may be treated with an electroless plating solution comprising the above explained reducing agent and conductive metal ions to form a conductive metal layer by electroless plating.

By progressing the reducing or plating step, conductive metal ions included in the metal nuclei may be reduced, or in a region on which metal nuclei are formed, conductive metal ions included in the electroless plating solution may be chemically reduced, thus selectively forming a satisfactory conductive pattern on a predetermined region. Wherein, the metal nuclei and the adhesion-activated surface may strongly bond to the chemically reduced conductive metal ions, and as the result, a conductive pattern may be selectively formed on a predetermined region more easily.

And, in the remaining region on which a conductive pattern is not formed, the non-conductive metal compound with NASICON structure is uniformly dispersed in the resin structure.

Meanwhile, according to another aspect of the invention, provided is a resin structure having a conductive pattern, obtained by the composition and method for forming a conductive pattern. The resin structure comprises a polymeric resin substrate; a non-conductive metal compound dispersed in the polymeric resin substrate, and having a NASICON crystal structure represented by the Chemical Formula 1; an adhesion-activated surface including a metal nucleus including a first metal or an ion thereof exposed on a surface of a predetermined region of the polymeric resin substrate; and a conductive metal layer formed on the adhesion-activated surface.

In the resin structure, the predetermined region on which the adhesion-activated surface and the conductive metal layer are formed may correspond to a region of the polymeric resin substrate to which an electromagnetic wave is irradiated. And, the metal or ion thereof included in the metal nuclei of the adhesion-activated surface may be derived from the non-conductive metal compound with NASICON structure. Meanwhile, the conductive metal layer may be derived from the metal included in the non-conductive metal compound with NASICON structure, or derived from conductive metal ion included in an electroless plating solution.

And, the resin structure may further comprise remnants derived from the non-conductive metal compound. Wherein at least a part of metals included in the non-conductive metal compound may be discharged, and thus, the remnants may have a vacancy formed on at least a part thereof.

And, the resin structure may have impact strength of about 4.0 J/cm or more, or about 4.0 to 8.0 J/cm as measured as Izod notched type according to ASTM D256, despite the addition of the above explained non-conductive metal compound. Thus, it may be used to provide a polymer resin product that maintains excellent mechanical properties while having a conductive pattern on a polymeric resin substrate.

The above explained resin structure may be applied for various objects such as antennas integrated into a mobile phone case, a variety of sensors, MEMS structures, RFID tags, and the like.

As explained above, according to the present invention, a variety of resin products having various fine conductive patterns may be satisfactorily and easily formed by a simplified method of irradiating electromagnetic wave such as laser and reducing or plating.

EXAMPLES

Hereinafter, the action and the effects of the invention will be explained in detail with reference to the following Examples. However, these are presented as examples of the invention, and the right scope of the invention is not limited thereto.

Preparation Example 1: Synthesis of Non-Conductive Metal Compound $CuSn_2(PO_4)_3$ Copper pyrophosphate and tin pyrophosphate were mixed in a stoichiometric ratio, and fired at about 1100° C. for 3 hours, to synthesize a non-conductive metal compound $CuSn_2(PO_4)_3$ by a solid state reaction.

The XRD pattern and the electron microscope image of the synthesized compound are shown in FIG. 3a and FIG. 3b. As a result of analysis of XRD structure, it was confirmed that the $CuSn_2(PO_4)_3$ synthesized in Preparation Example 1 has a NASICON crystal structure.

According to the standard method of ASTM 2244, using a color coordinate measuring device of X-rite color eye 7000A, CIE Lab color coordinate of Preparation Example 1 was measured, and the measurement result is shown together with the photograph of the non-conductive metal compound of Preparation Example 1 in FIG. 4. As a result of the measurement, it was confirmed that the non-conductive metal compound of Preparation Example 1 has a color coordinate of $La*b*$=91.0, −5.3, 2.4.

Preparation Example 2: Synthesis of Non-Conductive Metal Compound $AgSn_2(PO_4)_3$ Silver nitrate, tin chloride and phosphoric acid were mixed in a stoichiometric ratio, and fired at about 900° C. for 2 hours, to synthesize a non-conductive metal compound $AgSn_2(PO_4)_3$ by a solid state reaction.

As a result of analysis of XRD structure, it was confirmed that the $AgSn_2(PO_4)_3$ synthesized in Preparation Example 2 has a NASICON crystal structure.

According to the standard method of ASTM 2244, using a color coordinate measuring device of X-rite color eye 7000A, CIE Lab color coordinate of Preparation Example 2 was measured. As a result the measurement, it was confirmed that the non-conductive metal compound of Preparation Example 2 has a color coordinate of $La*b*$=92.01, −3.07, 11.39.

Comparative Preparation Examples 1 to 3: Known Non-Conductive Metal Compounds Known non-conductive metal compounds $CuCr_2O_4$, $Cu_2(OH)(PO_4)$ and $Sb/SnO_2$ were respectively acquired, and appointed as Comparative Preparation Examples 1 to 3.

According to the standard method of ASTM 2244, using a color coordinate measuring device of X-rite color eye 7000A, CIE Lab color coordinates of Comparative Preparation Examples 1 to 3 were measured, and the measurement results are shown together with the photographs of the non-conductive metal compounds of Comparative Preparation Examples 1 to 3 in FIG. 4. As a result of the measurement, it was confirmed that the non-conductive metal compounds of Comparative Preparation Examples 1 to 3 have darker colors compared to Preparation Example 1

Example 1: Formation of Conductive Pattern by Direct Irradiation of Laser

Using a basic resin of polycarbonate resin, a non-conductive metal compound with NASICON structure of $CuSn_2(PO_4)_3$ (particle diameter: 0.2 to 2 μm) prepared in Preparation Example 1, and additives for a process and stabilization, a composition for forming a conductive pattern by irradiation of an electromagnetic wave was prepared.

As the additives, a heat stabilizer (IR1076, PEP36), a UV stabilizer (UV329), a lubricant (EP184), and an impact modifier (S2001) were used.

Based on the polycarbonate resin, 7 wt % of the non-conductive metal compound with NASICON structure, and 5 wt % of the other additives were mixed to obtain a composition, which was then extruded through an extruder at a temperature of 260 to 280° C. The composition in the form of an extruded pellet was injection molded into a substrate with a diameter of 100 mm and thickness of 2 mm and an izod bar according to ASTM standard at about 260 to 270° C.

To the injection molded specimen, laser was irradiated under conditions of 40 kHz, 10 W (wavelength: 1064 nm) to activate the surface, and an electroless plating process was conducted as follows.

A plating solution (hereinafter a PA solution) was prepared by dissolving 3 g of copper sulfate, 14 g of Rochelle salt, and 4 g of sodium hydroxide in 100 ml of deionized water. To 40 ml of the prepared PA solution, 1.6 ml of formaldehyde was added as a reducing agent. The resin structure of which surface has been activated by laser was immersed in the plating solution for 4 to 5 hours, and then, washed with distilled water.

By the above explained method, a resin structure having a conductive pattern of Example 1 was formed and the photograph is shown in FIG. 5. Referring to FIG. 5, it is confirmed that a good conductive pattern (a copper metal layer) was formed on the resin structure.

Examples 2 to 7: Formation of Conductive Pattern by Direct Irradiation of Laser Compositions for forming a conductive pattern were respectively prepared by the same method as Example 1, except that based on the polycarbonate resin, 8 wt % of white pigment $TiO_2$ was additionally used.

Thereafter, resin structures having a conductive pattern were formed by the same method as Example 1, except that laser irradiation conditions were changed to 9.8 W (Example 2), 11.2 W (Example 3), 12.6 W (Example 4), 14.0 W (Example 5), 15.4 W (Example 6), and 16.8 W (Example 7).

The photographs of Examples 2 to 7 are shown together in FIG. 6. Referring to FIG. 6, it is confirmed that good conductive patterns (copper metal layers) are formed on the resin structures, and white colors of polycarbonate resin and $TiO_2$ are confirmed in the regions on which a conductive pattern is not formed.

Comparative Example 1: Formation of Conductive Pattern by Direct Irradiation of Laser A resin structure having a conductive pattern was formed by the same method as Example 1, except that based on the polycarbonate resin, 5 wt % of $CuCr_2O_4$ (particle diameter: 0.5 to 5 µm) of Comparative Preparation Example 1 was used as a non-conductive metal compound.

Comparative Examples 2 and 3: Formation of Conductive Pattern by Direct Irradiation of Laser A resin structure having a conductive pattern of Comparative Example 2 was formed by the same method as Example 1, except that based on the polycarbonate resin, 4 wt % of $Cu_2(OH)(PO_4)$ (particle diameter: 0.1 to 2 µm) of Comparative Preparation Example 2 was used as a non-conductive metal compound.

And, a resin structure having a conductive pattern of Comparative Example 3 was formed by the same method as Comparative Example 2, except that based on the polycarbonate resin, 6 wt % of white pigment $TiO_2$ was additionally used to form a composition for forming a conductive pattern.

Comparative Example 4: Formation of Conductive Pattern by Direct Irradiation of Laser A resin structure having a conductive pattern was formed by the same method as Example 1, except that based on the polycarbonate resin, 5 wt % of $Sb/SnO_2$ (particle diameter: 3 to 5 µm) of Comparative Preparation Example 3 was used as a non-conductive metal compound.

Experimental Example 1: Assessment of Adhesive Strength of the Conductive Pattern of a Resin Structure First, in the Examples 1, 2 and Comparative Examples 1 to 4, conductive patterns were formed, and then, adhesive strengths of the conductive patterns to the polymeric resin substrates were assessed by peel test using a predetermined tape according to a standard method of ISO 2409.

According to the peeled area of the conductive patterns, assessment was made under the ISO class standard as follows.

1. class 0 grade: The peeled area of the conductive pattern is 0% of the conductive pattern to be assessed.
2. class 1 grade: The peeled area of the conductive pattern is greater than 0% and 5% or less of the conductive pattern to be assessed.
3. class 2 grade: The peeled area of the conductive pattern is greater than 5% and 15% or less of the conductive pattern to be assessed.
4. class 3 grade: The peeled area of the conductive pattern is greater than 15% and 35% or less of the conductive pattern to be assessed.
5. class 4 grade: The peeled area of the conductive pattern is greater than 35% and 65% or less of the conductive pattern to be assessed.
6. class 5 grade: The peeled area of the conductive pattern is greater than 65% of the conductive pattern to be assessed.

The assessment results of the adhesive strengths of the conductive patterns are summarized in the following Table 1.

Experimental Example 2: Assessment of Mechanical Properties (MFR and Impact Strength) and Chromaticity of a Resin Structure The MFR's (Melt Flow Rate, g/10 min, 300 □) of the resin structures of Examples 1, 2 and Comparative Examples 1 to 4 were measured by the method of ASTM D1238.

And, the impact strengths of the conductive patterns (or plating layers) formed on the resin structure of Examples 1 to 7 and Comparative Examples 1 to 4 were measured as Izod notched type by the method of ASTM D256.

The assessment results of mechanical properties are summarized in the following Table 1. The mechanical properties are summarized in comparison to a bare PC without a non-conductive metal compound and a conductive pattern.

In addition, according to the standard method of ASTM 2244, using a color coordinate of X-rite color eye 7000A, CIE Lab color coordinates were measured in the resin structures of Examples 1 to 7 and Comparative Examples 1 to 4, and as a result of the measurement, derived L values are shown in the following Table 1.

TABLE 1

| | Content of non-conductive metal compound (wt %) | MFR (g/10 min) | Impact strength (J/cm) | Adhesive strength (grade) | Chromaticity L |
|---|---|---|---|---|---|
| Example 1 | 7 | 13 | 6.02 | 0 | 72.5 |
| Example 2 | | 17 | 6.22 | 1 | 92.2 |
| Comparative Example 1 | 5 | 18 | 7.14 | 1 | 30.4 |
| Comparative | 4 | 31 | 6.33 | 1 | 76.5 |

TABLE 1-continued

| | Content of non-conductive metal compound (wt %) | MFR (g/10 min) | Impact strength (J/cm) | Adhesive strength (grade) | Chromaticity L |
|---|---|---|---|---|---|
| Example 2 Comparative Example 3 | | 32 | 5.82 | 1 | 91.8 |
| Comparative Example 4 | 5 | 14 | 3.57 | 2 | 72.8 |
| Bare PC | — | 17 | 7.04 | — | 82.9 |

Referring to Table 1, it was confirmed that in Examples 1 and 2, resin structures of bright colors (particularly, bright color similar to a Bare PC) could be prepared although higher contents of additives were included compared to Comparative Examples. It was also confirmed that in Examples 1 and 2, good conductive patterns exhibiting adhesive strengths similar to or more excellent than those obtained with the existing non-conductive metal compound could be formed.

In addition, it was confirmed that in Examples 1 and 2, although higher contents of non-conductive metal compounds were used compared to Comparative Examples, resin structures maintaining excellent heat stability and mechanical properties could be obtained.

The invention claimed is:

1. A composition for forming a conductive pattern by electromagnetic irradiation, comprising:
   a polymer resin; and
   a non-conductive metal compound including a first metal and a second metal, having a NASICON crystal structure of Chemical Formula 1:

$AB_2(PO_4)_3$ or $AB_2P_3O_{12}$      [Chemical Formula 1]

where A represents at least one metal selected from the group consisting of Cu, Ag and Au, and B represents at least one metal selected from the group consisting of Sn, Zr, Ge, Hf, Zn, Mn, Co, Ni, Cd, Pd and Pt;
   wherein a metal nucleus including the first metal or an ion thereof can be formed from the non-conductive metal compound by exposure to electromagnetic irradiation.

2. The composition of claim 1, wherein the non-conductive metal compound has L value according to CIE Lab color coordinate of 90 or more.

3. The composition of claim 1, wherein the non-conductive metal compound has an a* value according to CIE Lab color coordinate of −10 to 10, and a b* value of −3 to 20.

4. The composition of claim 1, wherein the polymer resin comprises a thermosetting resin.

5. The composition of claim 1, wherein the polymer resin includes at least one selected from the group consisting of ABS (acrylonitrile poly-butadiene styrene) resin, polyalkyleneterephthalate resin, polycarbonate resin, polypropylene resin, and polyphthalamide resin.

6. The composition of claim 1, wherein the non-conductive metal compound is included in the content of 0.1 to 15 wt % based on the total composition.

7. The composition of claim 1, further comprising one or more additives selected from the group consisting of a flame retardant, a heat stabilizer, a UV stabilizer, a lubricant, an antioxidant, an inorganic filler, a colorant, an impact modifier, and a functional modifier.

8. The composition of claim 7, wherein the flame retardant includes a phosphorus-based flame retardant and an inorganic flame retardant.

9. The composition of claim 1, wherein the polymer resin comprises a thermoplastic resin.

10. A resin structure having a conductive pattern, comprising
    a polymeric resin substrate;
    a non-conductive metal compound dispersed in the polymeric resin substrate, and having a NASICON crystal structure of Chemical Formula 1:

$AB_2(PO_4)_3$ or $AB_2P_3O_{12}$      [Chemical Formula 1]

where A and B respectively represent the first metal and the second metal that are different from each other;
    an adhesion-activated surface including a metal nucleus including the first metal or an ion thereof exposed on the surface of a predetermined region of the polymeric resin substrate; and
    a conductive metal layer formed on the adhesion-activated surface that forms the conductive pattern.

11. The resin structure of claim 10, wherein the predetermined region on which the adhesion-activated surface and the conductive metal layer are formed corresponds to a region of the polymeric resin substrate to which an electromagnetic wave is irradiated.

12. The resin structure of claim 10, wherein the resin structure has impact strength of 4.0 J/cm or more, as measured as Izod notched type according to ASTM D256.

* * * * *